US006518856B1

(12) United States Patent
Casale et al.

(10) Patent No.: US 6,518,856 B1
(45) Date of Patent: Feb. 11, 2003

(54) RF POWER DIVIDER/COMBINER CIRCUIT

(75) Inventors: Thomas J. Casale, West Newbury, MA (US); Steven Arlin, Chelmsford, MA (US)

(73) Assignee: Signal Technology Corporation, Danvers, MA (US)

( * ) Notice: Subject to any disclaimer, the term of this patent is extended or adjusted under 35 U.S.C. 154(b) by 0 days.

(21) Appl. No.: 09/417,354

(22) Filed: Oct. 13, 1999

(51) Int. Cl.[7] .............................. H01P 5/12; H01P 5/08; H03H 7/38

(52) U.S. Cl. ......................... 333/124; 333/17.3; 333/32

(58) Field of Search ................................ 333/124, 125, 333/101, 17.3, 32–35, 127

(56) References Cited

U.S. PATENT DOCUMENTS

| | | | | |
|---|---|---|---|---|
| 4,780,685 A | * 10/1988 | Ferguson | ................ | 330/124 D |
| 5,281,932 A | * 1/1994 | Even-Or | ...................... | 333/32 |
| 6,223,022 B1 | * 4/2001 | Birth et al. | ................... | 455/80 |
| 6,323,742 B1 | * 11/2001 | Ke | ............................ | 333/101 |

* cited by examiner

*Primary Examiner*—Robert Pascal
*Assistant Examiner*—Kimberly E Glenn
(74) *Attorney, Agent, or Firm*—George A. Herbster

(57) ABSTRACT

A power combiner circuit for RF signals includes a multi-path network for conveying a plurality of RF signals over a selected path or paths, to a common node. A switched RF impedance transformer connects between the common node and an RF load. The switched RF transformer switches between first and second transformation functions depending upon the number of network paths that are selected.

16 Claims, 5 Drawing Sheets

RF POWER DIVIDER/COMBINER CIRCUIT

BACKGROUND OF THE INVENTION

1. Field of the Invention

This invention generally relates to RF communications and more specifically to an N-way divider/combiner that facilitates the control of a transmitted RF signal.

2. Description of Related Art

Wireless RF applications, particularly in the 800 to 1000 MHz range, have become wide spread in recent years. These are frequencies of choice for wireless telephones and similar devices. Particular effort has been directed to the development of the high-power RF transmitting facilities for such applications including wireless telephone repeaters.

Many of these applications include multiple amplifiers to provide an appropriate RF output power. For example, a 600 watt transmitting facility may include four 150 watt transmitters operating in parallel, rather than a single 600 watt transmitter. Using lower powered amplifiers provides reliability through redundancy and, in many cases reduced costs as the cost of several lower powered RF amplifiers may be less than a single high powered amplifier. Moreover, the use of the lower powered amplifiers allows different sites to be configured at different power levels without requiring different amplifiers. For example, a single amplifier could be used to provide a 150 watt transmitting facility; two amplifiers, a 300 watt transmitting facility; etc.

However, a single, high powered transmitter is characterized by simplified impedance matching to an antenna or other RF load. Generally the impedance match remains essentially the same for a given frequency regardless of the power being transmitted. With parallel, identical, lower powered amplifiers, however, the problem becomes more difficult because the output impedance of the collective amplifiers will be $Z_0/N$ where $Z_0$ is the characteristic impedance of one amplifier and N is the number of amplifiers operating in parallel. Thus, the impedance at a common node for a four-amplifier transmitting facility will vary between 50 ohms and 12½ ohms depending upon the number of amplifiers operating in parallel. If the impedance is not well matched, VSWR and insertion losses increase.

number of power dividers and combiners have been proposed for minimizing the effects of impedance mismatches. Generally in these systems a single RF source produces an RF signal that divides into equi-phase, equi-amplitude input signals to parallel amplifiers. The combiner section then recombines the four amplified outputs to produce the high powered RF output signal. One particular approach, known in the art as a Wilkinson circuit, uses transmission lines at a characteristic impedance to convey signals to different ports. The ports are tied through resistors to a common node. The transmission lines may be anywhere from a quarter wavelength ($\lambda/4$) to a half wavelength ($\lambda/2$). In such systems, however, optimal performance occurs when all parallel paths are energized. Insertion losses when only one amplifier is operating can become 75% of the input. With these losses it can be seen, particularly if equal amplitudes and phases are not maintained, that significant heat will be generated. In systems using resistors, this heat can lead to circuit failure.

U.S. Pat. No. 4,893,093 (1990) to Cronauer et al. discloses a switched, power splitter in which a high frequency input signal is applied to a plurality of amplifiers. First transmission lines connect between the input and each of the amplifiers with each transmission line capable of being switched between a high level and a low level of impedance. A balanced resistor network is preferably coupled between the first transmission lines. Second transmission lines shunt across the first transmission lines and the impedance of each second transmission line can be altered to a predetermined percentage of the circuits input impedance. A control circuit switches the various transmission lines so that the impedance of the antenna remains balanced no matter how many of the first transmission lines are in the high impedance state.

U.S. Pat. No. 5,767,755 (1998) to Kim et al. discloses another embodiment of a power combiner with a plurality of transmission lines connecting a plurality of inputs to an output terminal. RF switches provide the selection of up to N channels as active channels. The electrical length from each RF switch to the output terminal is preferably one-half wavelength at a central frequency (i.e., $\lambda/2$ at $f_0$). When a switch is on, the signal power applied to all of input terminals is combined at the output terminal. When the switch is off, the RF power incident to the switch is reflected and the transmission line connected between that switch and the output terminal appears as an open circuit. However, it does appear the output impedance at the combined circuit can vary over a range of 4:1.

U.S. Pat. No. 5,867,060 (1990) to Burkett, Jr. et al. discloses still another embodiment of a power combiner that will allow the selection of a number of amplifiers operating in parallel for driving a load having characteristic impedance. Each amplifier connects to a common node through a phasing line one half-wavelength at the characteristic impedance. A quarter wavelength transforming line then connects the common node to the load. This transforming line has an impedance that depends upon the number of circuits being energized simultaneously. Therefore it appears that in this system a wide range of mismatches can still occur.

U.S. Pat. No. 5,872,491 (1999) to Kim et al. disclose a Wilkinson-type power divider/combiner that has a selective switching capability. The switchable power divider/combiner includes N first switches connecting N input/output transmission lines to a common junction and N second switches connecting N isolation resistors coupled to the N input/output transmission lines to a common node. The activation of each pair of the first and second switches to a closed or opened switch position controls the operating mode. Optimal impedance matching is provided by adjusting the impedance values to provide optimal impedance matching in both La N-way and (N−1)-way operating modes. While this system appears to optimize for a particular configuration in anticipation of a failure of one path, it does not appear readily adapted for providing for optimal impedance if more than one channel becomes inactive.

Examination of each of the foregoing patents and other prior art that is representative of prior art indicates that each of the approaches is overly complex. As a result problems of heating and insertion losses and impedance mismatches continue to exist. What is needed is a power divider/combiner that can provide good VSWR and insertion loss characteristics over a wide range of input powers.

SUMMARY

Therefore it is an object of this invention to provide an RF power divider/combiner that is simple to construct and cost effective.

Another object of this invention is to provide an RF power divider/combiner that exhibits a low VSWR for a wide range of operating power.

Still another object of this invention is to provide an RF power divider/combiner that exhibits low insertion losses for a wide range of operating power.

In accordance with one aspect of this invention, a power combiner circuit for RF signals includes a multi-path network for conveying RF signals from a plurality of RF sources to a common node. A switched RF impedance transformer between the common node and an RF load switches between first and second transformation functions depending upon the number of sources that are active simultaneously thereby to minimize any impedance mismatch between the common node and the RF load.

In accordance with another aspect of this invention, a power divider/combiner apparatus for operation with an RF signal source and a selectable number of a given plurality of RF amplifiers that energize an RF load includes a source connection for the RF signal source and a load connection for the RF load. An power dividing network connects each of the source connections to one of a plurality of amplifier input connections. A switched transmission line connects each amplifier output connection to a common node. A single-pole double-throw RF switch has a common terminal connected to the load connection and first and second switched terminals. A first impedance transformer connects between the common node and the first switched terminal. A second impedance transformer connects between the first and second switched terminals. In the first RF switch position the common node connects to the first impedance transformer to the load connection. In the second RF switch position the common node connects to the load connection through the first and second impedance transformers.

BRIEF DESCRIPTION OF THE DRAWINGS

The appended claims particularly point out and distinctly claim the subject matter of this invention. The various objects, advantages and novel features of this invention will be more fully apparent from a reading of the following detailed description in conjunction with the accompanying drawings in which like reference numerals refer to like parts, and in which:

DESCRIPTION OF ILLUSTRATIVE EMBODIMENTS

Figure 1:
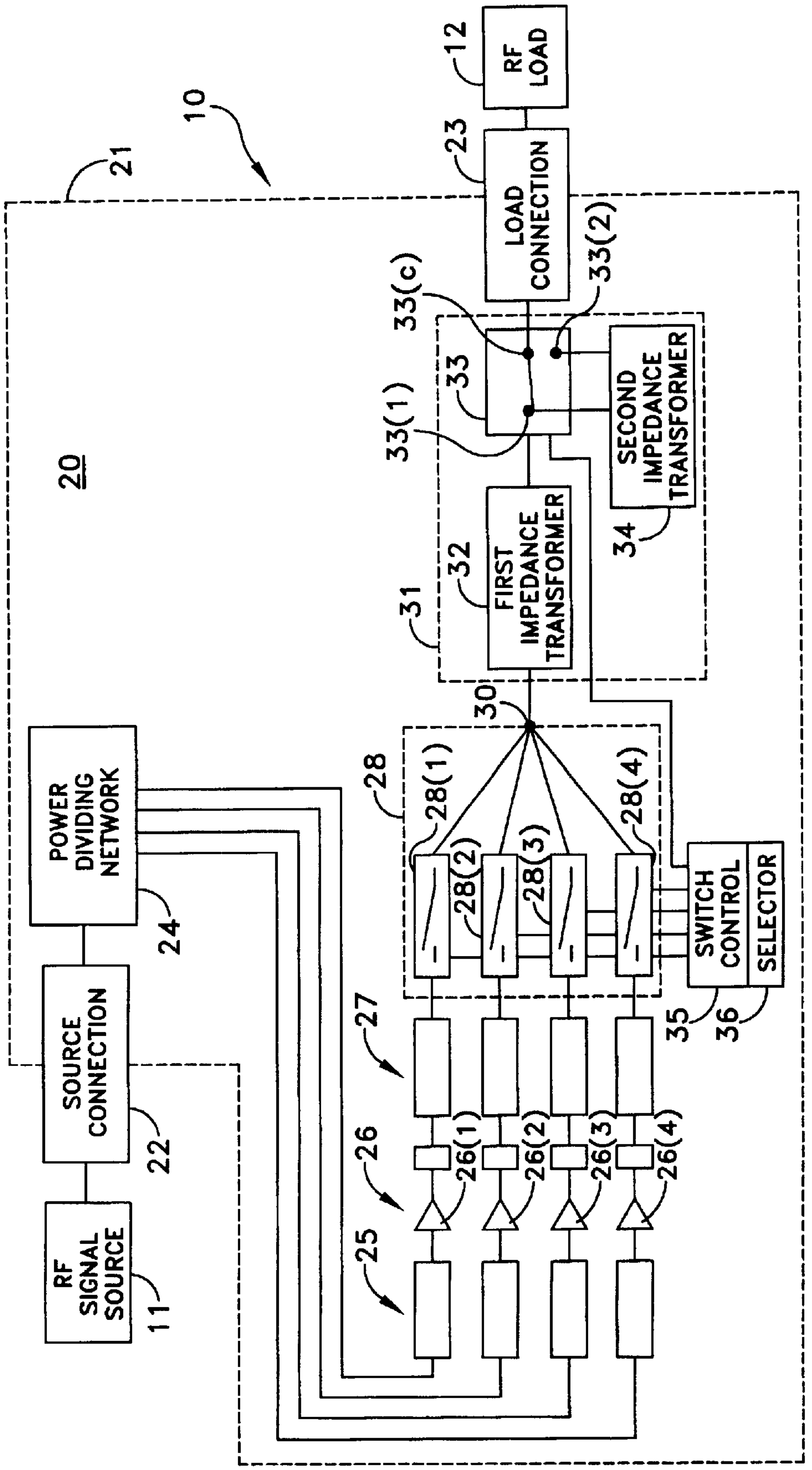
FIG. 1 is a schematic view in block diagram of a power combiner divider circuit constructed in accordance with this invention.

FIG. 1 depicts an RF system 10 that includes an RF signal source 11 and an RF load 12. A power divider/combiner circuit 20 includes a grounded chassis 21, a source connection 22 for receiving signals from the RF signal source and a load connection 23 for providing signals to the RF load 12. The source and load connections 22 and 23 typically will be constituted by coax feed-through couplings for receiving a connector on a transmission line from the RF signal source 11 or from the RF load 12. However, the source and load connections 22 and 23 could be any variety of connection.

A power dividing network can take any of several conventional forms that will divide the signal appearing at the source connection 22 into equi-phase, equi-amplitude signals. For an N-way power combiner circuit the division is into N paths. N=4 is a typical value and is used in the following discussion. Specifically, FIG. 1 depicts four such paths to a series of amplifier input connections 25. These amplifier input connections might be as simple as solder connections on a circuit board or feed-through couplings for conveying the individual split RF signals. to the input of parallel amplifiers in a multi-path amplifier network 26 including amplifiers 26(1) through 26(4).

Signals from the individual amplifiers 26(1) through 26(4) then pass through amplifier output connections 27 to a plurality of switched transmission lines 28. The amplifier output connections 27 will typically comprise a feed through RF connection, like those that are used for the amplifier input connections 26. Again, it is important the connections have the same electrical length and other characteristics so that the signals arriving at the switched transmission lines have equal amplitudes and phases.

In a four-way system the switched transmission lines 28 convey the four signals from the amplifiers 26 to common node 30. Using $Z_0$ to indicate the characteristic impedance of the RF load, each of the switched transmission lines 28 will, as described later, include a switched impedance such that if only one amplifier connects to the common node 30, the impedance at the common node will be the characteristic impedance.

A switched RF impedance transformer 31 connects the common node 30 to the load connection 23. A first impedance transformer 32 conveys signals from the common node 30 to a first terminal 33(1) of an RF switch 33. A second impedance transformer 34 connects between the first terminal 33(1) and a second terminal 33(2). A common switch connection 33(C) attaches to the load connection 23. In this embodiment, the RF switch 33 is a single-pole, double-throw switch. Other switch configurations, such as a pair of single-pole, single-throw switches, could be substituted.

Figure 2:
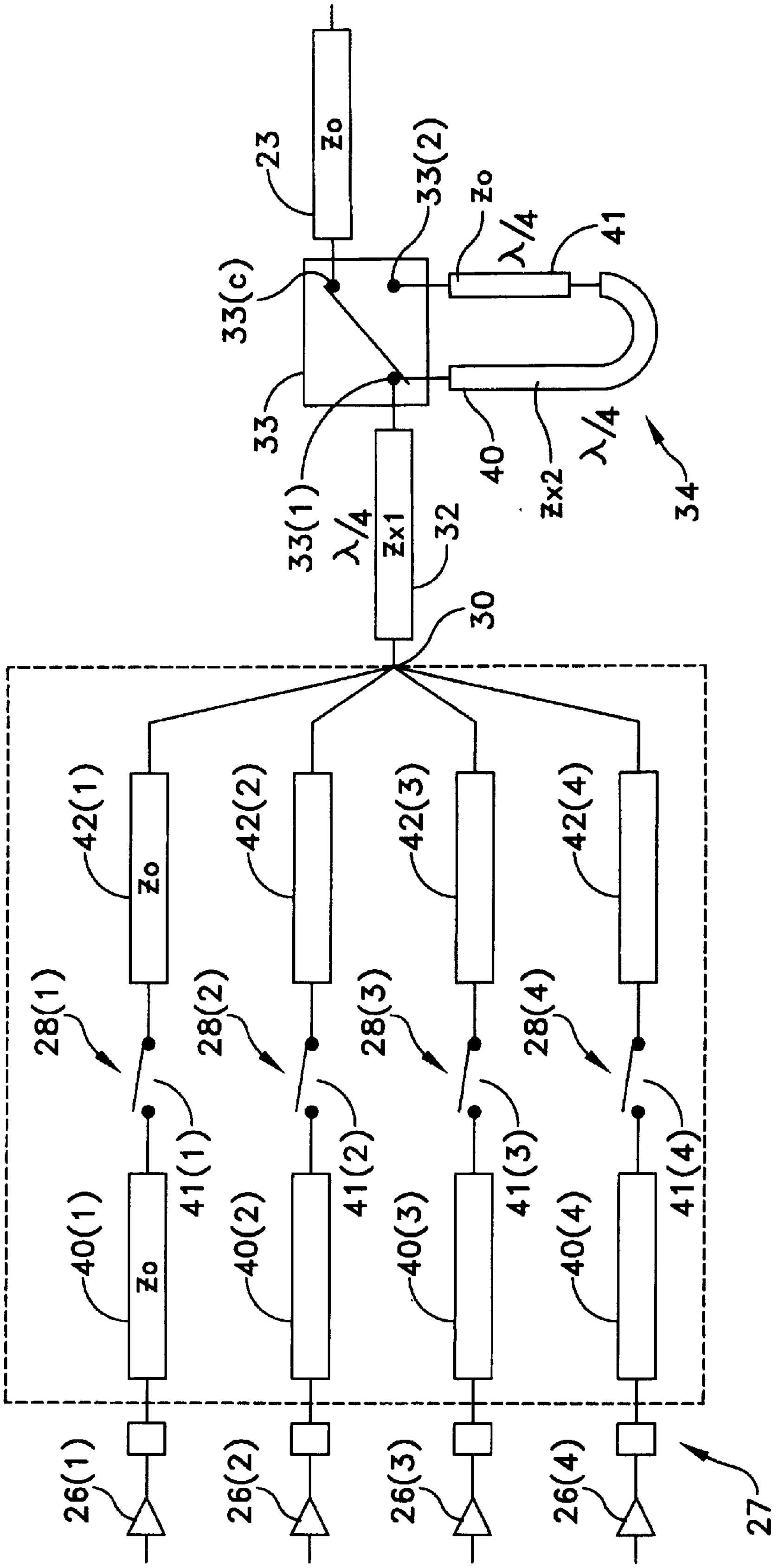
FIG. 2 schematically depicts the power combiner section of FIG. 1 with four amplifiers operating simultaneously.
Figure 3:
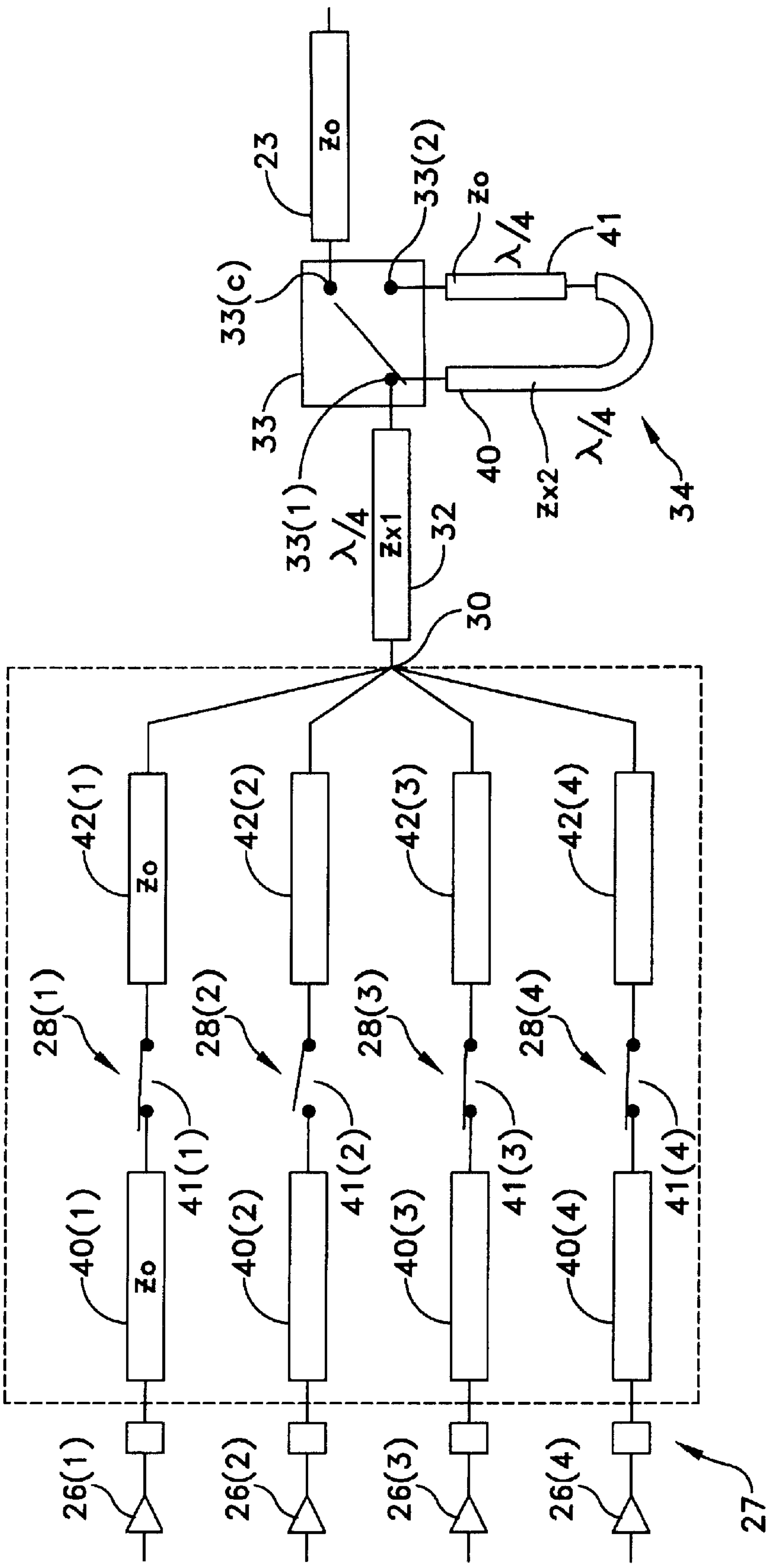
FIG. 3 schematically depicts the power combiner section of FIG. 1 with three amplifiers operating simultaneously.
Figure 4:
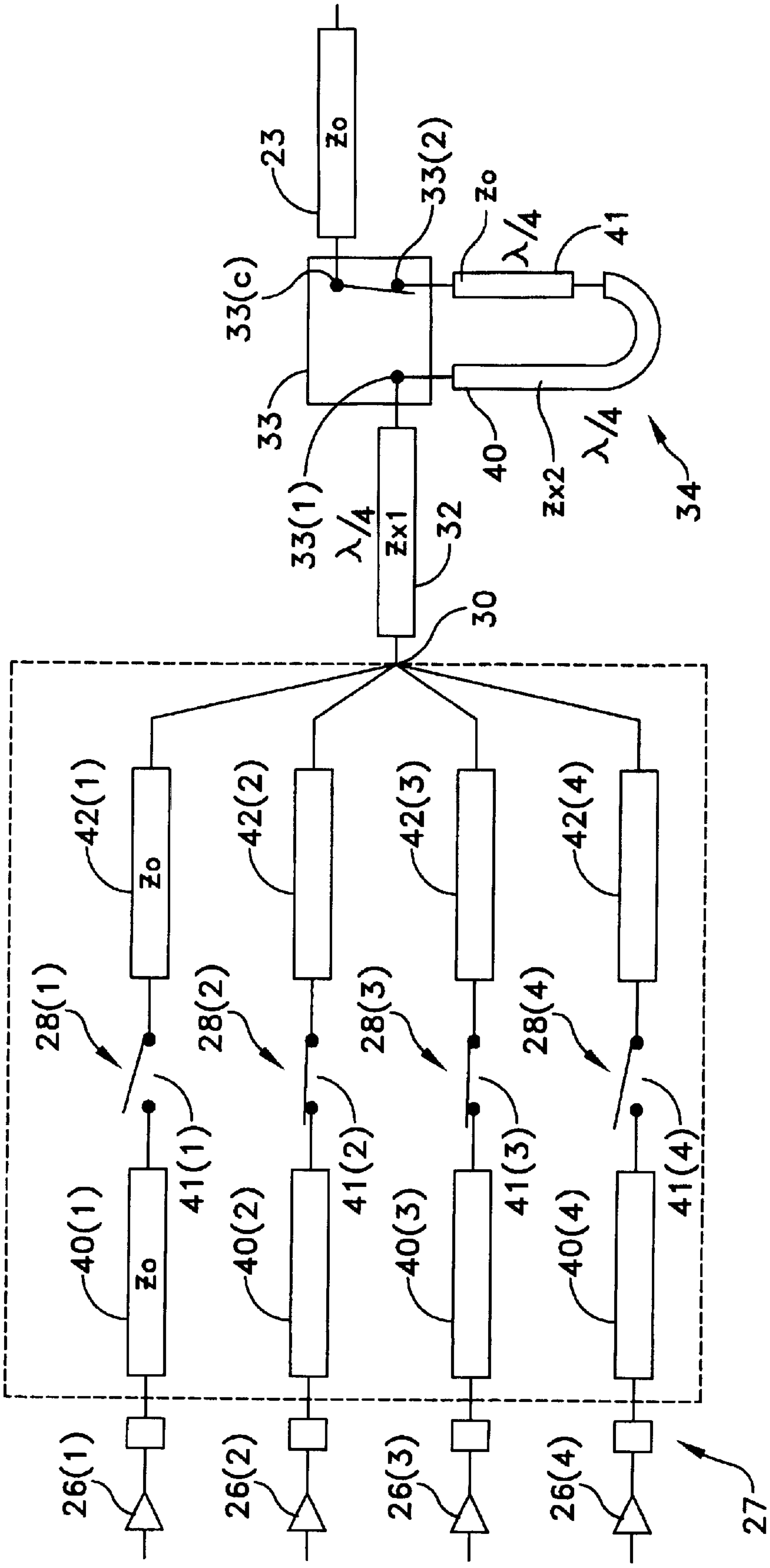
FIG. 4 schematically depicts the power combiner section of FIG. 1 with two operating simultaneously.
Figure 5:
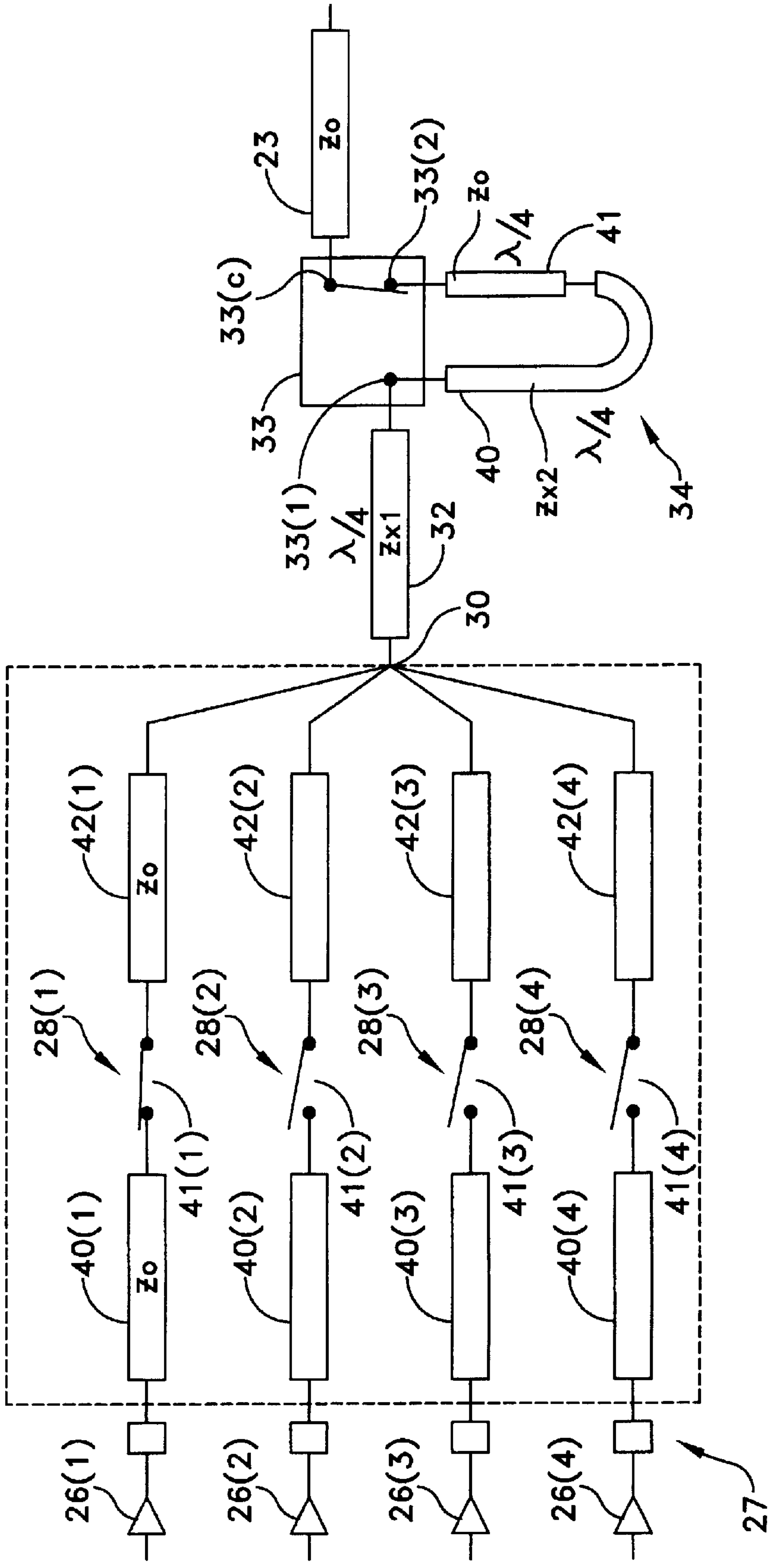
FIG. 5 schematically depicts the power combiner section of FIG. 1 with one amplifier operating simultaneously.

A switch control circuit 35 connects to each of the switched transmission lines 28 and to the RF switch 33 to operate the switches in response to selection signals provided by a selector 36. Circuits for performing the selection and control functions according to predetermined requirements are well known in the art. For this particular embodiment if the switch selector 36 selects either (1) any three of the switch transmission lines 28 or (2) all four of those lines, the RF switch 33 will connect to the terminal 33(1) as shown in FIGS. 1 through 3. If any one or any two of the switched transmission lines 28 are energized simultaneously, the switch connects the terminal 33(C) to the second terminal 33(2) as shown in FIGS. 4 and 5.

Thus, the circuit in FIG. 1 includes a multi-path network including the switched transmission lines 28 for conveying RF signals from a plurality of RF sources, such as represented by the multi-path amplifier network 26, to the common node 30. The switched RF impedance transformer 31 comprising the first and second impedance transformers 32 and 34 and the RF switch 33 provides first and second transformation functions depending upon the number of sources that are active simultaneously. An RF output including the load connection 23 and RF load 12 receives the signals from the switched RF impedance transformer 31.

Now referring particularly to FIGS. 1 and 2, the switched transmission lines 28 include four paths 28(1) through 28(4), each with an identical structure so only the path 28(1) is described in detail. Signals from the RF amplifier 26(1) pass through the amplifier output connection 27(1) to the path 28(1). The path 28(1) includes a transmission line 40(1) of an arbitrary length at the characteristic impedance $Z_0$ of the RF load. The signal passes from the transmission line 40(1) to an RF switch 41(1). When the RF switch 41(1) is closed, a half wavelength transmission line 42(1) at the characteristic impedance $Z_0$ conveys the signal to the common node 30.

As will now be apparent, there are two characteristics of switched impedance line 28(1) that are important. First, when the RF switch 41(1) is closed, the output characteristic of the impedance looking back from the common node 30 is the load characteristic impedance, namely $Z_0$. Second, when an RF switch, such as the RF switch 41(1) is in an open circuit condition, the impedance at the common node 30 is infinite because the transmission line 42(1) is a half wavelength long. Thus, if the switch 41(1) is closed and the remaining switches 41(2) through 41(4) are open, the impedance at the common node 30 is the characteristic impedance typically $Z_0$=50 ohms. Conversely, if all four switches 41(1) through 41(4) are closed, the characteristic impedance at the common node 30 is one-quarter the characteristic impedance, that is, $Z_{30}=Z_0/N$.

Thus as shown in FIG. 2 where all four of the switches are closed, if $Z_0$ is 50 ohms, the characteristic impedance at the common node 30 for all four amplifiers operating simultaneously, $Z_{30}$(4)=12.5 ohms. FIG. 3 depicts a configuration with three of the switch transmission lines 28 being active. In this particular embodiment, the switches 41(1), 41(3) and 41(4) are closed. Any combination of three closed switches will provide identical results. In this case: $Z_{30}$(3)=$Z_0$/3 so for $Z_0$=50 ohms $Z_{30}$(3)=16.67 ohms Similar analyses apply to FIGS. 4 and 5. FIG. 4 depicts a system in which two switches 41(2) and 41(3) are closed. The impedance $Z_{30}$(2) at the common node 30 for two active amplifiers is 25 ohms. FIG. 5. depicts a system in which a single switch 41(1) is closed. For this single-amplifier operating mode the impedance $Z_{30}$(1) at the common node 30 is 50 ohms.

It has been found that one specific embodiment of the switched RF impedance transformer 31 reduces VSWR and insertion losses to acceptable levels by segregating the selection of signal paths into two operating modes, namely: a first mode in which any three or all four amplifiers are active simultaneously or a second mode in which any one or any two amplifiers are active simultaneously. For operation in the first mode the RF switch 33 operates with the common terminal 33(C) connected to the first terminal 33(1) so that the first impedance transformer 32 is in circuit between the common node 30 and the load connection 23. The first impedance transformer 32 transforms the common node impedance 30 to the load impedance. More specifically, in this position the impedance of the common node 30 will be either $Z_{30}$(3)=$Z_3$ or $Z_{30}$(4)=$Z_0$(4)/2. The mean impedance, $Z_{mean}$(3,4), at the common node 30 when three or four amplifiers are active simultaneously is then given by:

$$Z_{mean}(3,4)=\sqrt{Z_{30}(3)*Z_{30}(4)} \quad (1)$$

The value of the first impedance $Z_{x1}$ for the first impedance transfer 32 to match the $Z_{mean}$(3,4) impedance to the load impedance $Z_0$ is given by:

$$Z_{x1}=\sqrt{Z_{mean}(3,4)*Z_0} \quad (2)$$

Substituting Equation (1) into Equation (2), the impedance $Z_{x1}$ of the first impedance transformer is:

$$Z_{x1}=\sqrt[4]{Z(1)*Z(2)*Z_0^2} \quad (3)$$

For the second operating mode, when the switch connects to terminal 33(2), the mean impedance is given by:

$$Z_{mean}(1,2)=\sqrt{Z_{30(1)}*Z_{30(2)}} \quad (4)$$

where $Z_{30}$(1) and $Z_{30}$(2) represent the impedances when any one or any two amplifiers are active simultaneously. The impedance at terminal 33(1), then is:

$$Z_{33}=\frac{Z_{x1}^2}{Z_{mean}(1,2)} \quad (5)$$

In order to bring this impedance to match this impedance to the impedance at the load connection 23, the second impedance transformer 34 must provide an impedance transformation $Z_{x2}$ according to:

$$Z_{x2}=\sqrt{Z(33)*Z_0} \quad (6)$$

where $Z_{33}$ is the impedance at the terminal 33(1). Substituting Equations (4) and (5) into Equation (6) yields the relationship:

$$Z_{x2}=\sqrt[4]{\frac{Z_{x1}^2*Z_0}{\sqrt{Z(1)*Z(2)}}} \quad (7)$$

For a characteristic impedance $Z_0$=50 ohms, Equations (3) and (7) yield the values $Z_{x1}$=27 ohms and $Z_{x2}$=32 ohms.

The second impedance transformer 34 comprises both a quarter-wavelength transmission line 40 having the impedance $Z_{x2}$ and a second quarter-wave length transmission line at the characteristic impedance $Z_0$. Consequently when switch 33 connects to terminal 33(1), the second impedance transformer, having a total length of one-half wavelength, reflects an open circuit impedance to the terminal 33(1) and has no effect on the impedance transformation in the first operating mode.

Analysis of this circuit shows the following impedances at the common terminal 33(C) and the resulting VSWR and insertion loss measurements with a characteristic impedance of $Z_0$=50 for a system operating at 600 watts (i.e., 150 watts/path).

| NO. OF ACTIVE AMPLIFIERS | VSWR | INSERTION LOSS (DB) |
|---|---|---|
| 4 | 1.25 | 0.5 |
| 3 | 1.25 | 0.5 |
| 2 | 1.5 | 0.7 |
| 1 | 1.5 | 0.7 |

The industry has defined certain acceptable levels of operation for power divider/combiner circuits. A power divider/combiner that operates with the VSWR and insertion loss characteristics in the foregoing table operates with a VSWR and insertion loss that is below those acceptable levels for a broad spectrum of applications using high-powered RF signals, especially in the 900 MHz range.

Therefore in accordance with this invention a power divider/combiner has been disclosed in which the combination of the outputs from a plurality of switching channels is more closely matched to an RF load characteristic impedance for all operating modes merely be adding a single RF switch capable of handling the total RF power and first and second impedance transformers having the characteristics described above. Such impedance transformers are readily constructed using microstrip or other technologies in an inexpensive and reliable fashion. As will be apparent, a power divider/combiner constructed in accordance with this invention eliminates the need for compensating resistors and other components that are susceptible to failure in a high power RF application. Thus it is possible to produce a combiner that closely matches the impedance for a number of different operating conditions so that the resulting output signals are characterized by having a low VSWR and by exhibiting a low insertion loss.

It will be apparent this invention has been disclosed in terms of a particular embodiment incorporating a 4-way path. For example, the second impedance transformer 34 is disclosed in the form of a J-shaped impedance transformer 40 and a stub 41 that together form a U-shaped structure. Other configurations might also be used. The specific disclosure includes a first operating mode when three or four are active and a second operating mode when one or two amplifiers are active simultaneously.

Other configurations could use the same concepts to achieve even better matching, albeit at a high cost. For example, in a four-way combiner, three RF switches, like the RF switch 33, could be connected to be in a first position so they were in series when a single amplifier was active. This would provide a match. A matching transformer for two active amplifiers having a length of one-half wavelength could connect between the first and second terminals of the first RF switch. When two amplifiers were active, the first switch would shift the impedance switch in the circuit to match the common node impedance value $Z_0/2$. Likewise, one-half wavelength long impedance transformers match the common node impedance when three or four amplifiers were active could be attached across the terminals of the second and third RF switches. Thus, if it were decided to switch a one-amplifier to a three amplifier operation, only the second RF switch would operate to transfer the signal through the impedance transfer attached to that RF switch. Alternatively, the impedance transfer of FIG. 1 might merely be cascaded using values for the impedance transformers derived from Equations (3) and (7).

It will be apparent that the foregoing and many other modifications can be made to the disclosed apparatus without departing from the invention. Therefore, it is the intent of the appended claims to cover all such variations and modifications as come within the true spirit and scope of this invention.

What is claimed as new and desired to be secured by Letters Patent of the United States is:

1. A power combiner circuit for RF signals from a plurality of RF sources comprising:

A) a multi-path network including a plurality of switched inputs for conveying RF signals from the plurality of RF sources to a common node, B) an RF output, and C) a switched RF impedance transformer connected between said common node for switching between first and second transformation functions depending upon the number of sources that are active simultaneously, whereby the output impedance at said common node is more closely matched to a predetermined characteristic load impedance at said RF output.

2. A power combiner circuit as recited in claim 1 wherein said switched RF impedance transformer provides the first and second impedance transformation functions when first and second sets of switched inputs are selected respectively.

3. A power combiner circuit as recited in claim 2 wherein said plurality of switched inputs includes n inputs and n switches for individually switching each of said inputs to said common node, said switched RF impedance transformer producing the first and second transformation functions when first and second predetermined numbers of said n switches, respectively, connect each of their respective inputs to said common node.

4. A power combiner circuit as recited in claim 2 wherein said plurality of switched inputs includes four RF inputs and four input switches for selecting up to four inputs for simultaneous connection to said common node, said switched RF impedance transformer producing the first transformation function when the number of connected inputs is two or less and the second transformation function when the number of connected inputs is greater than two.

5. A power combiner circuit as recited in claim 2 wherein said switched RF impedance transformer includes:

i) an RF switch having a common connection to said RF output and first and/second switch connections, ii) a first impedance transformer between said common node and said first switch connection, and iii) a second impedance transformer between said first and second switch connections whereby said first impedance transformer is in circuit between said common node and said RF output when said RF switch is in its first position and said first and second impedance transformers are in circuit between said common node and said RF output when said RF switch is in its second position.

6. A power combiner circuit as recited in claim 5 wherein said RF output has a characteristic impedance, $Z_0$, said first impedance transformer transforming a mean impedance at the common node when said plurality of switched inputs includes three and four RF signals to the characteristic impedance.

7. A power combiner circuit as recited in claim 6 wherein said second impedance transformer extends for one-half wavelength and transforms the mean impedance at the first switch connection when said plurality of switched inputs includes one or two RF inputs to the characteristic impedance.

8. A power combiner circuit as recited in claim 5 wherein the characteristic impedance at said common node has values of Z(1) through Z(4) when one to four of the plurality of switched inputs are energized simultaneously and the impedances of said first and second impedance transformers, $Z_{x1}$ and $Z_{x2}$ are:

$$z_{x1} = {}^{4}\sqrt{z(\mathbf{3})^{*}z(\mathbf{4})^{*}z_0^{2}}$$

and $$Z_{x1} = \sqrt[4]{Z(3) * Z(4) * Z_0^2} \quad \text{and}$$

$$Z_{x2} = \sqrt[4]{\frac{Z_{x1}^2 * Z_0}{\sqrt{Z(1) * Z(2)}}}$$

whereby the standing wave ratio and power losses for different selections of RF inputs are minimized.

9. A power divider/combiner apparatus for operation with an RF signal source and a selectable number of a given plurality of RF amplifiers for energizing an RF load, said apparatus comprising:

A) an source connection for the RF signal source;

B) a load connection for the RF load;

C) an amplifier input connection for each of the inputs of the given plurality of RF amplifiers, D) a power dividing network that connects said source connection to the plurality of amplifier input connections, E) an amplifier output connection to each output of the given plurality of RF amplifiers, F) a switched transmission line from each of said amplifier output connections to a common node, G) a single-pole, double-throw RF switch with a common terminal to said load connection and with first and second switched terminals, H) a first impedance transformer between said common node and said first switched terminal, and I) a second impedance transformer between said first and second switched terminals whereby in the first RF switch position said common node connects through said first impedance transformer to said load connection and said second impedance transformer reflects an open-circuit impedance to said first switched terminal and whereby in the second RF switch position said common node connects to said load connection through said first and second impedance transformers in series.

10. A power divider/combiner apparatus as recited in claim 9 wherein the given plurality is four and said RF switch is placed in its first position when three or four of said switched transmission lines are active and in its second position when one or two of said switched transmission lines are active.

11. A power divider/combiner apparatus as recited in claim 10 wherein the RF load has a characteristic impedance of $Z_0$ and the impedances at said common node are Z(3) and Z(4) when three or four of said switched transmission lines are active, said first impedance transformer having an impedance of $Z_{x1}$ given by:

$$Z_{x1}=\sqrt[4]{Z(\mathbf{1})*Z(\mathbf{2})*Z_0^2}$$

whereby the standing wave ratio and power losses for the selections of three and four RF inputs are minimized.

12. A power divider/combiner apparatus as recited in claim 11 wherein the characteristic impedance at said common node has values of Z(1) and Z(2) when one or two of said switched transmission lines are active, said second impedance transformer having an impedance of $Z_{x2}$ given by:

$$Z_{x2} = \sqrt[4]{\frac{Z_{x1}^2 * Z_0}{\sqrt{Z(1)*Z(2)}}} \tag{11}$$

whereby the standing wave ratio and power losses for any selection of one through four RF inputs are minimized.

13. A power divider/combiner apparatus as recited in claim 10 wherein each of said four switched transmission lines comprises:

i) a first transmission line at the characteristic impedance from a corresponding one of the amplifier output connections, ii) a second, half-wavelength long transmission line from said common node, and iii) a single pole, single throw RF switch between said first and second transmission lines.

14. A power divider/combiner apparatus as recited in claim 13 wherein the RF load has a characteristic impedance of $Z_0$ and the impedances at said common node are Z(3) and Z(4) when three or four of said single pole, single throw RF switches are closed, respectively, said first impedance transformer having an impedance of $Z_{x1}$ given by:

$$Z_{x1} = \sqrt[4]{Z(3)*Z(4)*Z_0^2}$$

whereby the standing wave ratio and power losses for the selections of three and four RF inputs are minimized.

15. A power divider/combiner apparatus as recited in claim 14 wherein the characteristic impedance at said common node has values of Z(1) and Z(2) when one or two of said single pole, single throw RF switches are closed, respectively, said second impedance transformer having an impedance of $Z_{x2}$ given by:

$$Z_{x2} = \sqrt[4]{\frac{Z_{x1}^2 * Z_0}{\sqrt{Z(1)*Z(2)}}}$$

whereby the standing wave ratio and power losses for any selection of one through RF inputs are minimized.

16. A power divider/combiner apparatus as recited in claim 15 wherein said characteristic load impedance, $Z_0$, is 50 ohms, said first impedance transformer impedance, $Z_{1x}$, is 27 ohms and said second impedance transformer impedance, $Z_{x2}$, is 32 ohms.

* * * * *